United States Patent [19] [11] 3,906,247
Heffner [45] Sept. 16, 1975

[54] PROGRAMMABLE PROPORTIONAL CLOCK EDGE DELAY CIRCUIT

[75] Inventor: Samuel T. Heffner, Villa Park, Ill.

[73] Assignee: GTE Automatic Electric Laboratories Incorporated, Northlake, Ill.

[22] Filed: Jan. 16, 1974

[21] Appl. No.: 433,641

[52] U.S. Cl. ............. 307/293; 307/228; 307/235 R; 307/265; 328/55; 328/58; 328/147

[51] Int. Cl.²... H03K 5/13; H03K 4/08; H03K 5/04

[58] Field of Search........ 307/228, 265, 293, 235 R; 328/58, 55, 146, 147

[56] References Cited

UNITED STATES PATENTS

| | | | |
|---|---|---|---|
| 3,104,331 | 9/1963 | Zinke | 307/228 |
| 3,492,586 | 1/1970 | Leffmann | 307/228 |
| 3,569,842 | 3/1971 | Schroyer | 307/228 |
| 3,571,626 | 3/1971 | Reif | 307/293 |
| 3,575,618 | 4/1971 | Kawabata | 307/293 |
| 3,719,834 | 3/1973 | Dao | 307/228 |

*Primary Examiner*—Stanley D. Miller, Jr.

[57] ABSTRACT

A clock edge delay circuit which delays the edges of clock pulses supplied by a clock pulse source includes a ramp generator which generates linear ramp voltages, a digitally controlled reference voltage means which provides a selected one of a plurality of discrete reference voltages, and a voltage comparator having first and second inputs and an output, the first input being coupled to the ramp generator and the second input being coupled to the reference voltage means. The delay circuit additionally includes a ramp generator control means responsive to input pulse clock edges for initiating and terminating the ramp voltage generation. When the ramp voltage reaches a selected level relative to the discrete reference voltage, the circuit produces clock edges delayed in time from the input clock pulse edges by a preselected amount which is proportional to the selected reference voltage.

9 Claims, 5 Drawing Figures

PROGRAMMABLE PROPORTIONAL CLOCK EDGE DELAY CIRCUIT

BACKGROUND OF THE INVENTION

The present invention is generally directed to a circuit for delaying clock pulse edges and more particularly to a programmable clock pulse edge circuit.

In many electronic circuitry applications it is often necessary to delay the triggering edge of a clock pulse. When tight tolerances on clock timing are present, it is particularly advantageous to control the amount of delay automatically. In doing so, it is particularly advantageous to be able to provide rising or falling delayed clock edge transitions so as to be compatible with the many logic families available today.

Accordingly, it is a general object of the present invention to provide an improved clock edge delay circuit.

It is a more specific object of the present invention to provide a clock edge delay circuit which provides either rising or falling delayed clock edge transitions.

It is a still more specific object of the present invention to provide a clock edge delay circuit which may be programmed automatically to provide a preselected amount of delay.

It is another object of the present invention to provide a clock edge delay circuit which is digitally programmable to provide any one of a plurality of discrete delay times.

In general, the present invention provides a clock edge delay circuit for delaying the clock edges of input clock pulses supplied by a clock pulse source. The clock edge delay circuit comprises a ramp generator including a constant current source for generating linear ramp voltages, ramp generator control means responsive to successive input clock pulse edges for alternately initiating and terminating the ramp voltage generation, reference voltage means including a digital-to-analog converter for providing any selected one of a plurality of discrete reference voltages, and a voltage comparator having a first input, a second input and an output, the first input being coupled to the ramp voltage generator and the second input being coupled to the reference voltage means and providing delayed clock pulse edges at said output responsive to voltage comparisons on the inputs. When the ramp voltages bear a predetermined relation to the selected discrete reference voltage, the circuit at the voltage comparator output provides delayed clock edges delayed in time from the input clock pulse edges by a preselected amount proportional to the selected discrete reference voltage.

BRIEF DESCRIPTION OF THE DRAWINGS

The invention, together with further objects and advantages thereof, may best be understood by reference to the following description in conjunction with the accompanying drawings and in which the several figures of which like reference numerals indicate identical elements and in which.

DESCRIPTION OF THE PREFERRED EMBODIMENTS

Figure 1:
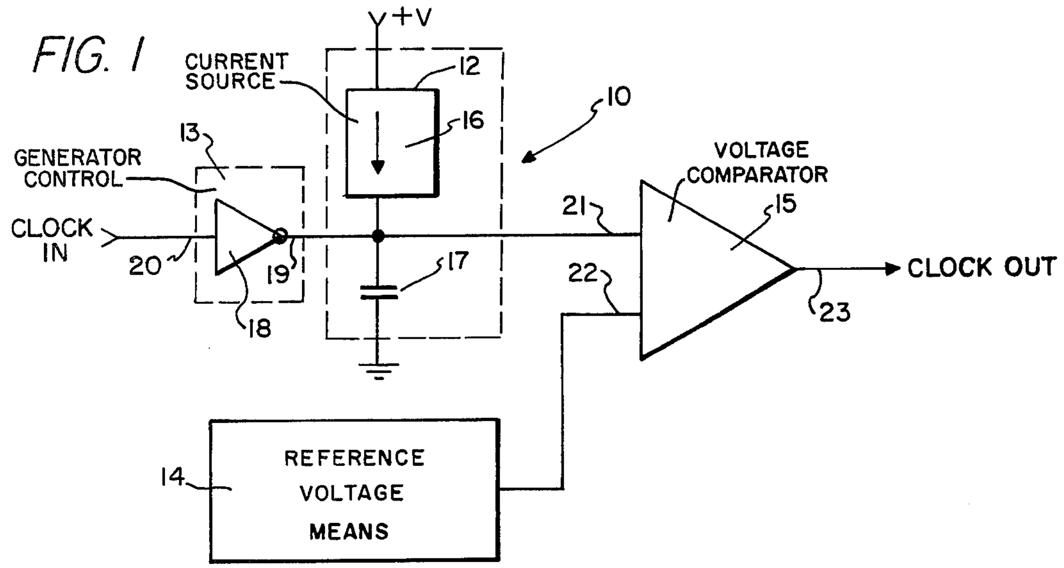
FIG. 1 is a block diagram of a clock edge delay circuit embodying the present invention.

Referring now to FIG. 1, there is shown a block diagram of a pulse edge delay circuit embodying the present invention. The pulse edge delay circuit comprises ramp generator 12 which generates ramp voltages, ramp generator control means 13, reference voltage means 14, and voltage comparator 15.

Ramp generator 12 comprises constant current source 16 and capacitor 17. The capacitor and constant current source generate at their junction a ramp voltage when the constant current source charges capacitor 17.

Coupled to the junction of constant current source 16 and capacitor 17 is the ramp generator control means 13 which comprises an open collector inverter 18 such as Texas instrument standard device type SN 7405. An open collector gate has an output that is connected internally only to the collector lead of the output stage and does not include a pull-up circuit or other additional connections. The open collector inverter is coupled to constant current source 16 and capacitor 17 at its output 19. Open collector inverter 18 additionally comprises an input 20 which is coupled to a clock pulse-source for receiving input clock pulses.

Voltage comparator 15 has a first input 21, second input 22, and output 23. Input 21 of voltage comparator 15 is coupled to the ramp generator at the junction of constant current source 16 and capacitor 17. Input 22 is coupled to the output 24 of reference voltage means 14.

The circuit provides the delayed clock edges at output 23 of voltage comparator 15 which is coupled to the switching circuitry to which the delayed clock edges are to be applied.

Figures 2A, 2B, 2C:
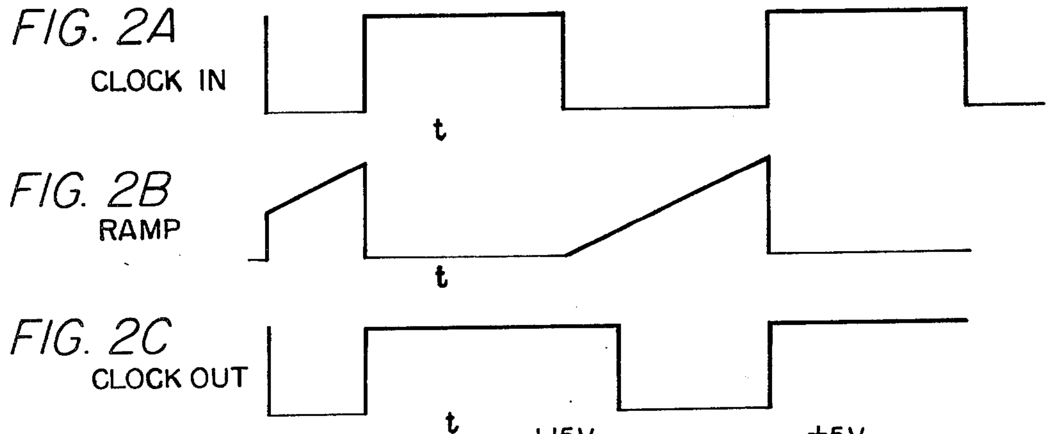
FIGS. 2A through 2C show various waveforms generated by the circuit of FIG. 1 as a function of time which may be utilized in understanding the present invention.

In operation, ramp generator control means 13 is responsive to the clock edges of the incoming clock pulses provided by the clock source to which input 20 of open collector inverter 18 is coupled to control the charging and discharging of capacitor 17 of ramp generator 19 to initiate and terminate the ramp voltage generation. As shown in FIGS. 2A, 2B and 2C, when an incoming clock pulse is received by input 20 of collector inverter 18, capacitor 17 is discharged to approximately a zero voltage level. When the trailing edge of the incoming clock pulse occurs, output 19 of open collector driver 18 allows capacitor 17 to be charged by constant current source 16 to initiate the generation of the ramp voltage. Thus, it can be seen that the ramp generator control means responsive to successive input clock pulse edges alternately initiates and terminates the ramp voltage generations.

The ramp voltage continues to increase until the ramp voltage delivered to input 21 of voltage comparator 15 bears a predetermined relation to the reference voltage at input 22 supplied from output 24 of reference voltage means 14. In this embodiment the predetermined relation is equality. At this point, voltage comparator 15 changes state and provides at output 23 a clock edge which is delayed from the trailing edge of the incoming clock pulse. Because ramp generator 12 generates a linear voltage ramp, the time delay between the delayed clock edge and the trailing edge of the input clock pulse is proportional to the reference voltage at input 22 of voltage comparator 15 supplied by reference voltage means 14.

When the next succeeding incoming clock pulse occurs the leading edge thereof causes open collector inverter 18 to discharge capacitor 17 back to a zero voltage level. From there, the sequence of events is repeated.

The waveforms of FIGS. 2A through 2C depict the operation of the circuit of FIG. 1 as just described when it is conditioned to provide a delayed clock edge which is negative going or in other words a falling edge. To provide the falling edge delay, the first input 21 of voltage comparator 15 is the negative voltage comparator input and the second input 22 is the positive input of the voltage comparator. If a rising delayed clock edge is desired, it is only necessary to switch the output leads from the ramp generator and reference voltage means so that the reference voltage means is connected to the negative input of the voltage comparator and the ramp generator is connected to the positive input of the voltage comparator.

Figure 3:
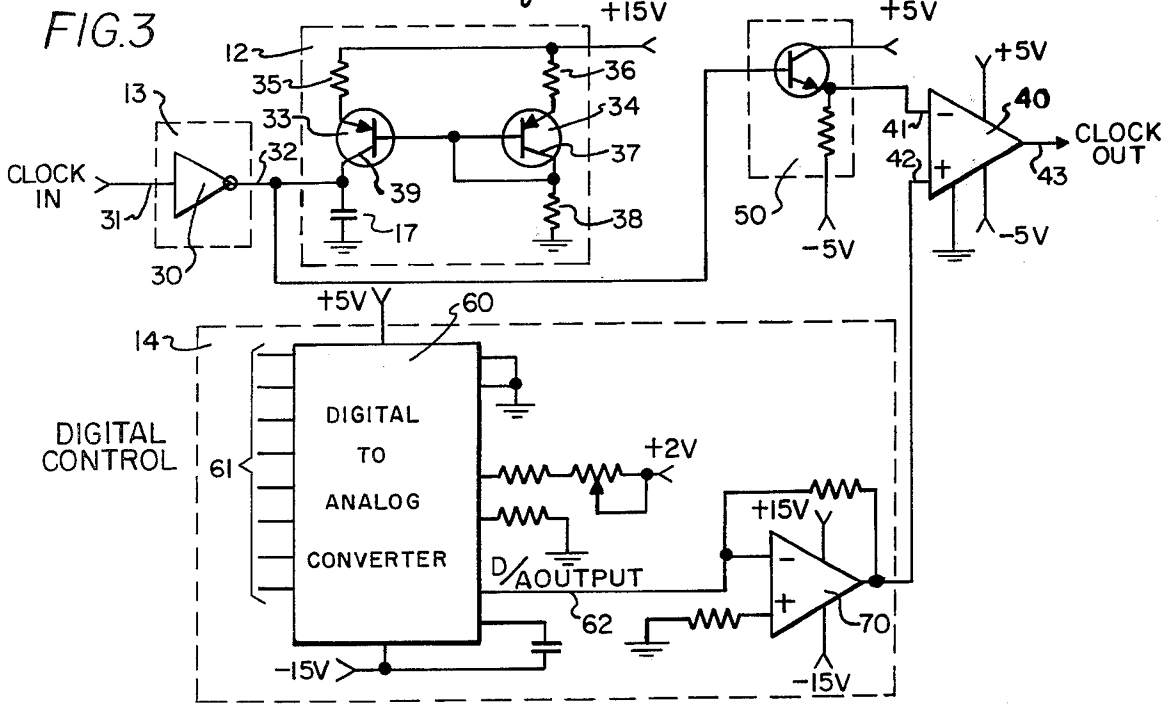
FIG. 3 is a schematic circuit diagram partially in block form showing a particular clock edge delay circuit embodying the present invention.

FIG. 3 shows a specific preferred embodiment of the clock pulse edge delay circuit as shown in FIG. 1.

Ramp generator control means 13 comprises an open collector inverter 30 having an input 31 and an output 32. Input 31 is adapted to be connected to a source of incoming clock pulses. Output 32 is coupled to ramp generator 12.

Ramp generator 12 comprises a pair of transistors 33 and 34 which have their bases mutually coupled together. Transistors 33, 34 have emitter resistors 35, 36 connected to a positive voltage potential for sustaining the operation of the ramp voltage generator. Transistor 34 has a collector 37 coupled to ground through resistor 38 and also coupled to the junction of the bases of transistors 33 and 34.

The transistors 33 and 34 and associated circuitry just described comprise the constant current source of ramp generator 12. Coupled to the collector 39 of transistor 33 is capacitor 17 which is charged by the current from the constant current source to produce the ramp voltages. The ramp voltages generated by ramp generator 12 are applied to negative input 41 of voltage comparator 40 through an emitter follower 50 of the type well-known in the art.

The clock pulse edge delay circuit of FIG. 3 contemplates automatic digital programming of the delay times and to this end, reference voltage means 14 comprises digital-to-analog converter 60 and operational amplifier 70. Digital-to-analog converter 60 includes a plurality of digital inputs 61. Digital-to-analog converter 60 is of the type well-known in the art that produces at its output 62 any one of a plurality of discrete current levels responsive to the particular digital input conditions at its input 61.

Output 62 of digital-to-analog converter 60 is coupled to an operational amplifier 70 which converts the discrete current levels provided by digital-to-analog converter 60 to discrete reference voltage levels to be applied to positive input 42 of voltage comparator 40. Therefore, the combined action of digital-to-analog converter 60 and operational amplifier 70 provides any selected one of a plurality of discrete reference voltages in response to the particular digital input conditions at inputs 61 of digital-to-analog converter 60.

With the ramp generator coupled to input 41 of voltage comparator 40 and with the reference voltage means 14 connected to input 42 of voltage comparator 40, voltage comparator 40 will provide at its output 43 negative going clock edges delayed in time relative to the trailing edge of the clock pulses supplied to input 31 of open collector inverter 30, the overall operation of which is identical to the operation of the block diagram of FIG. 1 as depicted in FIGS. 2A through 2C.

Again, if rising delayed clock pulse edges are desired, the connections from the ramp generator and reference voltage means need merely be reversed so that the ramp voltages are applied to the positive input 42 of voltage comparator 40 and the reference voltages from reference voltage means 14 are applied to the negative input 41 of voltage comparator 40.

From the foregoing, it can be appreciated that the present invention provides a clock pulse edge delay circuit which is truly programmable to provide a plurality of discrete pulse edge time delays. In the embodiment shown in FIG. 3, any one of a plurality of discrete time delays may be selected by appropriately conditioning the digital inputs 61 of digital-to-analog converter 60. For an n bit digital-to-analog converter, the time duration of the delay steps can be determined by the equation: $t_s = T_r \div 2^n$ where $t_s$ is the time delay per step, $T_r$ is the rise time of the ramp from the minimum reference voltage to the maximum reference voltage, and n is the number of bits.

The present invention therefore, provides a clock pulse edge delay circuit capable of providing either rising or falling clock edges. This makes the present invention compatible with any of the logic families available today. Additionally, the clock pulse edge delay circuit of the present invention is programmable so that discrete delay times may be selected automatically as required by the system into which it is incorporated.

The present invention also affords flexibility in selecting the total ramp time. The total ramp time can be varied by changing the value of capacitor 17 and the magnitude of the current supplied by the constant current source. Lastly, the present invention is particularly suited for use in systems where there are close tolerances on delay times inasmuch as the present invention is capable of delay control in the tens of nanoseconds region with delay time steps less than 1 nanosecond.

While particular embodiments of the invention have been shown and described, modifications may be made, and it is intended in the appended claims to cover all such modifications as may fall within the spirit and scope of the invention.

We claim:

1. In combination, a clock edge delay circuit for delaying the clock edges of input clock pulses supplied by a clock pulse source comprising:

a ramp generator including a constant current source for generating linear ramp voltages;

ramp generator control means responsive to successive clock pulse edges for alternately initiating and terminating said ramp voltage generation;

reference voltage means including a digital-to-analog converter for providing any selected one of a plurality of discrete reference voltages; and a voltage comparator having a first input, a second input and an output, said first input being coupled to said ramp voltage generator, said second input being coupled to said reference voltage means and providing delayed clock pulse edges at said output responsive to voltage comparisons on said input; whereby, when said ramp voltage bears a predetermined relation to said selected discrete reference voltage, said circuit at said voltage comparator output provides delayed clock edges delayed in time from said input clock pulse edges by a preselected amount proportional to said selected reference voltage.

2. A clock edge delay circuit in accordance with claim 1 wherein said first comparator input is a negative input and wherein said second comparator input is a positive input to thereby cause said delayed clock edges to be negative going.

3. A clock edge delay circuit in accordance with claim 1 wherein said first comparator input is a positive input and wherein said second comparator input is a negative input to thereby cause said delayed clock edges to be positive going.

4. A clock edge delay circuit in accordance with claim 1 where said ramp generator control means comprises an open collector inverter.

5. A clock edge delay circuit in accordance with claim 1 wherein said digital-to-analog converter has a plurality of digital inputs to provide selection of any one of said plurality of discrete reference voltages in response to the digital input conditions at said inputs.

6. A clock edge delay circuit in accordance with claim 1 wherein said digital-to-analog converter produces discrete current outputs and wherein said reference voltage means additionally includes an operational amplifier to convert said discrete current outputs of said digital-to-analog converter to said discrete reference voltages.

7. A clock edge delay circuit in accordance with claim 1 wherein said ramp generator additionally includes a capacitor coupled to said constant current source for being charged by said constant current source to produce said linear ramp voltages.

8. A clock edge delay circuit in accordance with claim 7 wherein said constant current source comprises first and second transistors having their bases mutually coupled and wherein the collector of said first transistor is coupled to said capacitor.

9. In combination, a clock edge delay circuit for delaying the clock edges of input clock pulses supplied by a clock pulse source comprising:

a ramp generator including a constant current source and a capacitor, said capacitor being coupled to said constant current source for being charged by said constant current source for generating linear ramp voltages;

ramp generator control means including an open collector inverter responsive to successive input clock pulse edges for controlling the charging and discharging of said capacitor to alternately initiate and terminate said ramp voltage generation;

reference voltage means including a digital-to-analog converter and an operational amplifier, said digital-to-analog converter having a plurality of digital inputs and providing any one of a plurality of discrete current outputs in response to the digital input conditions at said inputs, said operational amplifier being coupled to said digital-to-analog converter for converting said discrete current outputs to discrete reference voltages, said digital-to-analog converter and said operational amplifier combining to provide any selected one of a plurality of said discrete reference voltages; and a voltage comparator having a first input, a second input and an output, said first input being coupled to said ramp voltage generator, said second input being coupled to said reference voltage means and providing delayed clock pulse edges at said output responsive to voltage comparisons on said input terminals; whereby, when said ramp voltage bears a predetermined relation to said selected discrete reference voltage, said circuit at said voltage comparator output provides delayed clock edges delayed in time from said input clock pulse edges by a preselected amount proportional to said selected discrete reference voltage.

* * * * *